United States Patent [19]

Bayraktaroglu

[11] Patent Number: 5,132,764
[45] Date of Patent: Jul. 21, 1992

[54] MULTILAYER BASE HETEROJUNCTION BIPOLAR TRANSISTOR

[75] Inventor: Burhan Bayraktaroglu, Plano, Tex.

[73] Assignee: Texas Instruments Incorporated, Dallas, Tex.

[21] Appl. No.: 672,809

[22] Filed: Mar. 21, 1991

[51] Int. Cl.$^5$ .................. H01L 29/72; H01L 29/161; H01L 27/14
[52] U.S. Cl. ...................................... 357/34; 357/35; 357/16; 357/30
[58] Field of Search .................. 357/16, 35, 34, 30

[56] References Cited

U.S. PATENT DOCUMENTS

| | | | |
|---|---|---|---|
| 4,573,064 | 2/1986 | McLevige et al. | 357/16 |
| 4,672,414 | 6/1987 | Gabriel et al. | 357/34 |
| 4,794,440 | 12/1988 | Capasso et al. | 357/34 |

OTHER PUBLICATIONS

Dubon et al; "Double Heterojunction GaAs-GaAlAs Bipolar Transistors Grown by MOCVD for Emitter Coupled Logic Circuits"; 1983; IEEE; pp. 689-693; IEDM 83.
M. E. Hafizi, et al.; *Reliability Analysis of GaAs/AlGaAs HBTs Under Forward Current/Temperature Stress*; IEEE 1990; pp. 329-332.
P. M. Asbeck, et al.; *GaAlAs/GaAs Heterojunction Bipolar Transistors: Issues and Prospects for Application*; IEEE Transactions of Electron Devices, vol. 36, No. 10, Oct. 1989; pp. 2032, 2024-2042.
Herbert Kroemer; *(Invited) Heterostructures for Everything: Device Principle of the 1980's?*; Proceedings of the 12th Conference of Solid State Devices, Tokyo, 1980; Japanese Journal of Applied Physics, vol. 20 (1981) Supplement 20-1, pp. 9-13.

*Primary Examiner*—Rolf Hille
*Assistant Examiner*—Wael Fahmy
*Attorney, Agent, or Firm*—Dana L. Burton; Richard A. Stoltz; Richard L. Donaldson

[57] ABSTRACT

This is a p-n junction device and the device comprises: a substrate 10 composed of a semiconductor material; a heavily doped n type sub-collector layer 14 over the substrate; a n type collector layer 16 over the sub-collector layer; a heavily doped p type first base layer 18, over the collector layer; a p type second base layer 20, substantially thinner than the first base layer, over the first base layer, with the second base layer being less heavily doped than the first base layer; and a n type emitter layer 24 over the second base layer, whereby, the second base layer serves as a diffusion barrier between the base and the emitter. Other devices and methods are also disclosed.

10 Claims, 1 Drawing Sheet

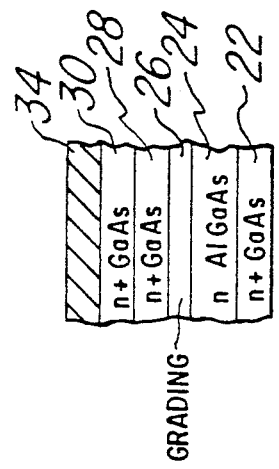
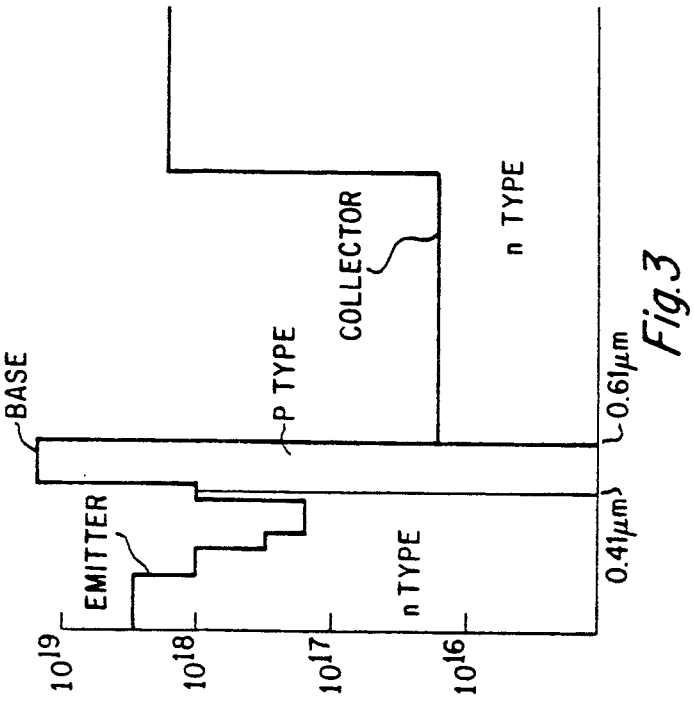
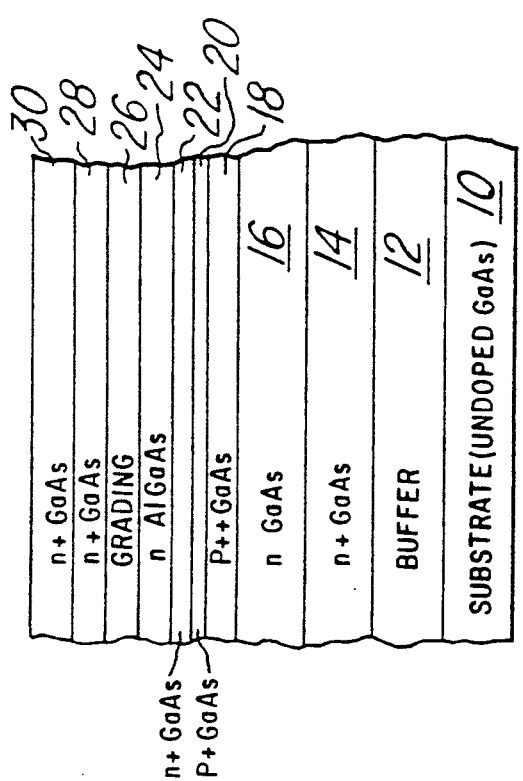
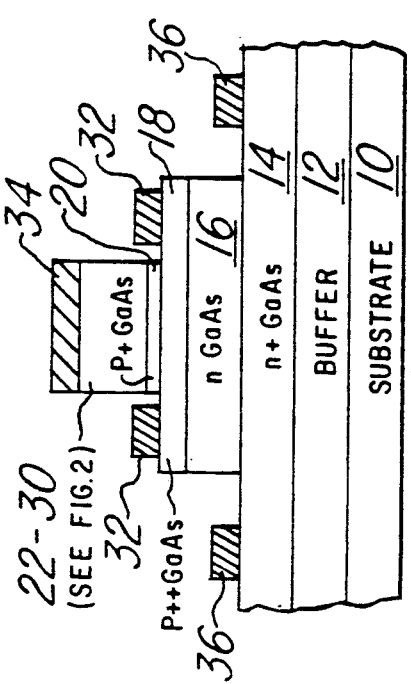

5,132,764

MULTILAYER BASE HETEROJUNCTION BIPOLAR TRANSISTOR

NOTICE (©) Copyright, *M* Texas Instruments Incorporated 1991. A portion of the disclosure of this patent document contains material which is subject to copyright and mask work protection. The copyright and mask work owner has no objection to the facsimile reproduction by anyone of the patent document or the patent disclosure, as it appears in the Patent and Trademark Office patent file or records, but otherwise reserves all copyright and mask work rights whatsoever.

CROSS-REFERENCE TO RELATED APPLICATIONS

The following coassigned patent applications are hereby incorporated herein by reference:

| Serial No. | Filing Date | TI Case No. |
| --- | --- | --- |
| 07/693490 | April 30, 1991 | TI-15800 |

FIELD OF THE INVENTION

This invention generally relates to p-n junction diffusion barriers.

BACKGROUND OF THE INVENTION

Without limiting the scope of the invention, its background is described in connection with the diffusion of dopants in the base layer of a heterojunction bipolar transistor (HBT), as an example.

Heretofore, in this field, it has been the object of device designers to develop HBTs to provide signal gain at microwave frequencies. A necessary consequence of this design goal is the formation of a structure that exhibits a low series base resistance. The speed of HBTs depends strongly on the device base resistance, which must be kept low to minimize resistive parasitics of the input.

Self-aligned emitter-base contact fabrication techniques are often used to minimize the series base resistance by lowering the distance between these two contacts. The lowering of the base sheet resistance is, however, the most effective way to achieve a reduction in all components of the base resistance (series resistance, contact resistance, and access resistance).

Low base sheet resistance in npn HBTs with base layers made from compound semiconductor materials, such as GaAs, has been achieved by heavily doping the base layer with Be or Zn. Base doping concentration in excess of $1 \times 10^{19}$ cm$^{-3}$ is needed for microwave performance. Such heavily doped base layers, however, are not stable under high temperature growth or under high temperature and bias operating conditions. Degenerately doped base layers can act as diffusion sources under these type of stress conditions and p-type dopant can diffuse into the emitter and/or the collector layer irreversibly changing the device parameters. The presence of a heavily doped n-type layer close to the p-type doped layer also causes diffusion enhancement during layer growth at elevated temperatures (typical growth temperatures in MOCVD is 600°–800° C.).

SUMMARY OF THE INVENTION

This is a p-n junction device. The device comprises: a substrate composed of a semiconductor material; a heavily doped n type sub-collector layer over the substrate; a n type collector layer over the sub-collector layer; a heavily doped p type first base layer, over the collector layer; a p type second base layer, substantially thinner than the first base layer, over the first base layer, with the second base layer being less heavily doped than the first base layer; and a n type emitter layer over the second base layer, whereby, the second base layer serves as a diffusion barrier between the base and the emitter.

Preferably, the device has a buffer layer over the substrate and under the sub-collector layer; a third base layer over the collector layer and under the first base layer, with the third base layer being less heavily doped than the first base layer, whereby the third base layer serves as a diffusion barrier between the base and the collector; a n type emitter stop layer over the second base layer and under the emitter layer, a grading layer over the emitter layer; a heavily doped n type first contact layer over the emitter layer or over a grading layer over the emitter layer; a n type second contact layer over the first contact layer, with the second contact layer being more heavily doped than the first contact layer; the first contact layer, second contact layer, first base layer, second base layer, sub-collector layer and collector layer are GaAs; and the emitter layer is AlGaAs.

This is also a method of forming a p-n junction device, the method comprises; forming a substrate composed of a semiconductor material; forming a heavily doped n type sub-collector layer over the substrate; forming a n type collector layer over the sub-collector layer; forming a heavily doped p type first base layer over the collector layer; forming a p type second base layer, substantially thinner than the first base layer, over the first base layer, with the second base layer being less heavily doped than the first base layer; forming a n type emitter layer over the second base layer, whereby, the second base layer serves as a diffusion barrier between the base and the emitter.

BRIEF DESCRIPTION OF THE DRAWINGS

In the drawings:

FIG. 1a–1b are cross-sectional views, at different processing stages, of a preferred embodiment of this invention;

FIG. 2 is a more detailed view of a section of FIG. 1b;

FIG. 3 is a doping profile of a preferred embodiment of this invention.

Corresponding numerals and symbols in the different figures refer to corresponding parts unless otherwise indicated.

DETAILED DESCRIPTION OF PREFERRED EMBODIMENTS

In FIG. 1a, the layers of a preferred embodiment heterojunction bipolar transistor (HBT) are shown, which are formed epitaxially. The layers are subsequently etched and contact is made, to form the device shown in FIG. 1b. FIG. 2 shows more detail of a portion of FIG. 1b (layers 22–30). Refer to FIGS. 1a–1b and FIG. 2 in the following discussion of the preferred embodiment HBT. The preferred doping levels and thicknesses stated in the description below are approximate values only.

The device is on a substrate 10 composed of a semi-insulating semiconductor material, such as undoped GaAs. A buffer layer 12, typically of undoped GaAs or AlGaAs, is epitaxially formed over the substrate 10. A sub-collector layer 14 of n+ GaAs is epitaxially formed over the buffer layer 12. The doping of the sub-collector layer 14 is preferably $2 \times 10^{-} cm^{-3}$, and the thickness is preferably 1.0 um. A collector layer 16 of n- to n type GaAs is epitaxially formed over the sub-collector layer 14. The doping of the collector layer 16 is preferably $2 \times 10^{16} cm^{-3}$ and the thickness is preferably 1.0 um. The dopant preferably used for n type doping, in this device, is Si.

The base region is formed over the collector layer 16 in two layers, with an optional third layer. The first base layer 18, of heavily (p++) doped p type GaAs material, typically doped $1-5 \times 10^{19} cm^{-3}$, forms the bulk of the base of the transistor. The first base layer 18 is preferably 1000-1500Å thick. This layer provides low sheet resistivity and low contact resistance. A thin, preferably 100-500Å thick, second base layer 20, of p+ GaAs, is epitaxially formed over the first base layer 18 and serves as a diffusion barrier for the first base layer. The second base layer doping is lighter than the doping of the first base layer, preferably $1-2 \times 10^{18} cm^{-3}$. The dopant preferably used for p type doping, in this device, is Zn. The thicknesses and doping concentrations of each layer is chosen considering the diffusion characteristics of each dopant. Generally, a layer of 100-500 Å is needed to effectively stop the diffusion of dopants to the p-n junctions. The concentration of dopant in these layers need to be low enough for minimal dopant outdiffusion (i.e. less than $5 \times 10^{-} cm^{-3}$ for Zn) while high enough to avoid significantly increased series resistance. The difference between the doping levels of these layers should also be minimized to avoid backdiffusion of minority carriers due to doping concentration profile induced reverse electrical field in the base. A third base layer, with the same doping and thickness as the second base layer 20, may be added between the collector layer 16 and the first base layer 18 to prevent diffusion into the collector during growth.

An optional n to n+ GaAs emitter stop layer 22 can be epitaxially formed over the second base layer. This layer 22 may be doped at $1 \times 10^{-} cm^{-3}$ and 100 Å thick. The emitter stop layer 22 serves as a barrier between the emitter and the base of the device further isolating the Zn to the base layers, therefore keeping the emitter n type, as needed for proper device performance. The emitter layer 24, of n type AlGaAs (the wide bandgap of which provides the heterojunction effect), is epitaxially formed over the emitter stop layer 22 (or over layer 20, if layer 22 is not used), with a preferred doping of $2 \times 10^{f} cm^{-3}$ and a preferred thickness of 1000 Å. A thin grading layer 26 is epitaxially formed over the emitter layer 24, in which the concentration of Al gradually diminishes (which provides a smooth bandgap transition from AlGaAs to GaAs). A first contact layer 28 is formed over the grading layer 26 of n+ GaAs. This layer's doping concentration and thickness are preferably $1 \times 10^{-} cm^{-3}$ and 1000 Å, respectively. A second contact layer 30, more highly doped than the first contact layer 28 (which provides a suitable surface for deposition of emitter metallization), is epitaxially formed over the first contact layer 28. The second contact layer is n+ GaAs with preferable doping of $5 \times 10 cm^{-3}$ and thickness of 1500 Å. The first contact layer 28 is used as a spacer between the first base layer 18 and the second contact layer 30. The use of this layer lowers the built-in electric field at the emitter-base junction, which is responsible for diffusion enhancement during epitaxial layer growth.

After epitaxial formation of the desired layers, the structure is anisotropically etched, preferably using a process such as reactive ion etching (RIE) in $BCl_3$ plasma, to form the desired structure, such as the one shown in FIG. 1b. At this point, contact formation may be done. The etching exposes the sub-collector layer 14 and the first base layer 18. If desired, the collector layer 16 may be left unetched on the sub-collector layer 14 and ion implantation may be used to contact the sub-collector layer 14 through the collector layer 16. The emitter contact 34, and the collector contacts 36 are preferably formed of layered AuGe/Ni/Au at thicknesses of 500 Å, 140 Å, and 4000 Å, respectively. The base contacts 32 are preferably layered Ti/Pt/Au at thicknesses of 500 Å, 250 Å, and 1500 Å, respectively.

In Table 1, below, the preferred ranges for both doping and thicknesses of the different layers of the device may be found. The preferred values may be found in the discussion above. A graphical representation of the typical doping levels of the device is shown in FIG. 3, and may be used for further clarification.

The described preferred embodiment of the present invention has the advantage that an HBT can be formed with low base resistance, and therefore high operating frequency, by the use of the heavily Zinc doped first base layer 18. If not for the inclusion of the less heavily doped second base layer 20, Zinc diffusion into the emitter 24, driven by heat dissipated by the device and the forward biased base-emitter p-n junction, would degrade the device performance irreversibly over its operating lifetime, producing unstable and unpredictable device performance.

A preferred embodiment has been described in detail hereinabove. It is to be understood that the scope of the invention also comprehends embodiments different from those described, yet within the scope of the claims. For example, while the p type dopant is referred to as Zn, it could also be materials such as C, Be, Mg, or Mn, and the n type dopant, while preferably silicon, could be a material such as S, or Se. Similarly, the AlGaAs emitter could be any appropriate wide bandgap material such as InGaP and the GaAs could be replaced with a material such as InGaAs or InP. The second base layer 20 can be used in relation to any two semiconductor layers where it is desired to control the diffusion of dopants from one layer into the other, for example, in any p-n junction device (such as diodes, transistors, lasers, etc).

Words of inclusion are to be interpreted as nonexhaustive in considering the scope of the invention.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

TABLE 1

| LAYER | TYPICAL DOPING RANGES (cm$^{-3}$) | TYPICAL THICKNESS RANGES (um) |
| --- | --- | --- |
| SUB-COLLECTOR 14 | $1-4 \times 10^{18}$ | 0.5-1.5 |
| COLLECTOR 16 | $2-10 \times 10^{16}$ | 0.3-3.0 |
| FIRST BASE 18 | $1-7 \times 10^{19}$ | 0.05-0.15 |
| SECOND BASE 20 | $1-2 \times 10^{18}$ | 0.01-0.05 |
| EMITTER STOP 22 | $5-10 \times 10^{17}$ | 0.006-0.015 |
| EMITTER 24 | $1-10 \times 10^{17}$ | 0.05-0.2 |
| GRADING 26 | $3-10 \times 10^{17}$ | 0.03-0.06 |
| FIRST CONTACT 28 | $1-3 \times 10^{18}$ | 0.1-0.2 |
| SECOND CONTACT 30 | $3-6 \times 10^{18}$ | 0.1-0.2 |

I claim:

1. A p-n junction device, said device comprising:
   a. a substrate composed of a semiconductor material;
   b. a heavily doped n type sub-collector layer over said substrate;
   c. a n type collector layer over said sub-collector layer;
   d. a heavily doped p type first base layer, over said collector layer;
   e. a p type second base layer, substantially thinner than said first base layer, over said first base layer, with said second base layer being less heavily doped than said first base layer and with said doping of said second base layer being essentially uniform;
   f. a n type emitter layer over said second base layer, whereby, said second base layer serves as a diffusion barrier between said base and said emitter.

2. The device of claim 1, wherein said device has a buffer layer over said substrate and under said sub-collector layer.

3. The device of claim 1, wherein said device has a third base layer over said collector layer and under said first base layer, with said third base layer being less heavily doped than said first base layer, and with said doping of said third base layer being essentially uniform, whereby said third base layer serves as a diffusion barrier between said base and said collector.

4. The device of claim 1, wherein said device has a n type emitter stop layer over said second base layer and under said emitter layer.

5. The device of claim 1, wherein said device has a grading layer over said emitter layer.

6. The device of claim 1, wherein said device has a heavily doped n type first contact layer over said emitter layer or over a grading layer over said emitter layer.

7. The device of claim 6, wherein said device has a n type second contact layer over said first contact layer, with said second contact layer being more heavily doped than said first contact layer.

8. The device of claim 7, wherein said first contact layer, second contact layer, first base layer, second base layer, sub-collector layer and collector layer are GaAs.

9. The device of claim 1, wherein said emitter layer is AlGaAs.

10. The device of claim 1, wherein said device is a heterojunction bipolar transistor.

* * * * *